(12) United States Patent
Bao et al.

(10) Patent No.: US 11,200,818 B2
(45) Date of Patent: Dec. 14, 2021

(54) METHOD AND DEVICE FOR PROCESSING ABNORMAL DATA

(71) Applicants: HEFEI XINSHENG OPTOELECTRONICS TECHNOLOGY CO., LTD., Anhui (CN); BOE Technology Group Co., Ltd., Beijing (CN)

(72) Inventors: Wenchao Bao, Beijing (CN); Xiaolong Wei, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 253 days.

(21) Appl. No.: 16/421,674

(22) Filed: May 24, 2019

(65) Prior Publication Data

US 2020/0104282 A1  Apr. 2, 2020

(30) Foreign Application Priority Data

Sep. 30, 2018  (CN) .......................... 201811162970.6

(51) Int. Cl.
*G09G 3/00* (2006.01)
*H01L 51/00* (2006.01)
(Continued)

(52) U.S. Cl.
CPC ........... *G09G 3/006* (2013.01); *G06F 16/901* (2019.01); *H01L 51/0031* (2013.01);
(Continued)

(58) Field of Classification Search
CPC ................ G09G 3/006; G09G 3/3208; G09G 2320/0285; G09G 2330/10; G06F 16/901; G06F 11/0736; H01L 51/0031
See application file for complete search history.

(56) References Cited

U.S. PATENT DOCUMENTS 6,389,441 B1 *  5/2002  Archer ...................... G06T 5/20
                                                    708/445
9,239,760 B2    1/2016  Baone et al.
(Continued)

FOREIGN PATENT DOCUMENTS

CN  104167176 A  * 11/2014
CN  104572333 A    4/2015
(Continued)

OTHER PUBLICATIONS

Translation of CN-104167176-A. (Year: 2014).*
(Continued)

*Primary Examiner* — Jay A Morrison
(74) *Attorney, Agent, or Firm* — Westman, Champlin & Koehler, P.A.

(57) ABSTRACT

The present disclosure provides a method and a device for abnormal data processing. The method includes: acquiring a queue of data to be detected, wherein the queue of data to be detected comprises M data arranged sequentially, M being a positive integer; filtering the queue of data to be detected with a filtering algorithm in at least two different orders respectively, wherein a window used in the filtering algorithm has a size of N, N being a positive integer smaller than M; determining abnormal data in the queue of data to be detected according to the filtering result; and performing data replacement on the abnormal data according to a preset rule.

5 Claims, 5 Drawing Sheets

(51) Int. Cl.
*G09G 3/3208* (2016.01)
*G06F 16/901* (2019.01)

(52) U.S. Cl.
CPC ... *G09G 3/3208* (2013.01); *G09G 2320/0285* (2013.01); *G09G 2330/10* (2013.01)

(56) References Cited

U.S. PATENT DOCUMENTS

| | | | |
|---|---|---|---|
| 9,965,240 B2 | 5/2018 | Deng et al. | |
| 10,200,685 B2 | 2/2019 | Gilmutdinov et al. | |
| 10,930,232 B2 | 2/2021 | Zeng | |
| 2013/0142262 A1* | 6/2013 | Ye | H04N 19/196 375/240.16 |
| 2015/0121160 A1 | 4/2015 | Baone et al. | |
| 2017/0132966 A1 | 5/2017 | Lim et al. | |
| 2017/0359574 A1 | 12/2017 | Gilmutdinov et al. | |
| 2018/0088885 A1 | 3/2018 | Deng et al. | |
| 2020/0043428 A1* | 2/2020 | Zeng | G09G 3/3607 |

FOREIGN PATENT DOCUMENTS

| | | |
|---|---|---|
| CN | 105700847 A | 6/2016 |
| CN | 105930391 A | 9/2016 |
| CN | 106652943 A | 5/2017 |
| CN | 107492341 A | 12/2017 |
| CN | 107863054 A | 3/2018 |

OTHER PUBLICATIONS

Office Action, including Search Report, for Chinese Patent Application No. 201811162970.6, dated Jun. 28, 2021, 12 pages.
English translation of first Office Action, for Chinese Patent Application No. 201811162970.6, dated Oct. 20, 2021, 9 pages.

* cited by examiner

METHOD AND DEVICE FOR PROCESSING ABNORMAL DATA

CROSS-REFERENCE TO RELATED APPLICATION(S)

This application claims priority to Chinese Application No. 201811162970.6, entitled "METHOD AND DEVICE FOR PROCESSING ABNORMAL DATA" and filed on Sep. 30, 2018, which is incorporated herein by reference in its entirety.

TECHNICAL FIELD

The present disclosure relates to the field of data processing technologies, and in particular, to a method and a device for processing abnormal data.

BACKGROUND

In the production process of an OLED (Organic Light-Emitting Diode) panel, compensation debugging of the OLED panel is required. When there is a defect in the OLED panel, the compensation data in the compensation debugging process may be abnormal, and the abnormal compensation data may cause a new line defect in the OLED panel.

SUMMARY

According to a first aspect, an abnormal data processing method is disclosed in the present disclosure. The abnormal data processing method includes: acquiring a queue of data to be detected, wherein the queue of data to be detected comprises M data arranged sequentially, M being a positive integer; filtering the queue of data to be detected with a filtering algorithm in at least two different orders respectively, wherein a window used in the filtering algorithm has a size of N, N being a positive integer smaller than M; determining abnormal data in the queue of data to be detected according to the filtering result; and performing data replacement on the abnormal data according to a preset rule.

Alternatively, said acquiring the queue of data to be detected includes: performing compensation debugging on an OLED display panel to detect whether there is abnormal compensation data; and acquiring a data queue in which the abnormal compensation data is located as the queue of data to be detected if there is abnormal compensation data.

Alternatively, said filtering the queue of data to be detected with the filtering algorithm in at least two different orders respectively includes: filtering the queue of data to be detected in a positive order; recording a first position in the queue of data to be detected at which the abnormal data is located when filtering the queue of data to be detected in the positive order; filtering the queue of data to be detected in a reverse order; and recording a second position in the queue of data to be detected at which the abnormal data is located when filtering the queue of data to be detected in the reverse order.

Alternatively, said determining the abnormal data in the queue of data to be detected according to the filtering result includes: determining whether the first position corresponds to the second position; and determining the first position as a position of data to be replaced in the queue of data to be detected, in response to the first position corresponding to the second position.

Alternatively, said performing the data replacement on the abnormal data according to the preset rule includes: acquiring an average value of data in the queue of data to be detected other than data at the position of data to be replaced; and replacing the data at the position of data to be replaced with the average value.

According to a second aspect, an abnormal data processing device is disclosed in the present disclosure. The abnormal data processing device includes: a data queue acquisition module, configured to acquire a queue of data to be detected, wherein the queue of data to be detected comprises M data arranged sequentially, M being a positive integer; a filtering module, configured to filter the queue of data to be detected with a filtering algorithm in at least two different orders respectively, wherein a window used in the filtering algorithm has a size of N, N being a positive integer smaller than M; a data-to-be-replaced determination module, configured to determine abnormal data in the queue of data to be detected according to the filtering result; and a data replacement module, configured to perform data replacement on the abnormal data according to a preset rule.

Alternatively, the data queue acquisition module includes: an abnormal data detection sub-module, configured to perform compensation debugging on an OLED display panel to detect whether there is abnormal compensation data; and a data queue acquisition sub-module, configured to acquire a data queue in which the abnormal compensation data is located as the queue of data to be detected if there is abnormal compensation data.

Alternatively, the filtering module includes: a positive order filtering sub-module, configured to filter the queue of data to be detected in a positive order; a first position recording sub-module, configured to record a first position in the queue of data to be detected at which the abnormal data is located when the positive order filtering sub-module filters the queue of data to be detected in the positive order; a reverse order filtering sub-module, configured to filter the queue of data to be detected in a reverse order; and a second position recording sub-module, configured to record a second position in the queue of data to be detected at which the abnormal data is located when the reverse order filtering sub-module filters the queue of data to be detected in the reverse order.

Alternatively, the data-to-be-replaced determination module includes: a position determination sub-module, configured to determine whether the first position corresponds to the second position; and a data-to-be-replaced determination sub-module, configured to determine the first position as a position of data to be replaced in the queue of data to be detected if the first position corresponds to the second position.

Alternatively, the data replacement module includes: an average value acquisition sub-module, configured to acquire an average value of data in the queue of data to be detected other than data at the position of data to be replaced; and a data replacement sub-module, configured to replace the data at the position of data to be replaced with the average value.

According to a third aspect, an abnormal data processing device is provided by the present disclosure, which includes: a memory that stores computer program codes; a processor configured to execute the computer program codes to perform the method according to the first aspect of the present disclosure.

According to a fourth aspect, a computer readable storage medium is provided by the present disclosure. The computer readable storage medium stores computer program codes, which, when executed by at least one processor, cause the at least one processor to perform the method according to the first aspect of the present disclosure.

DETAILED DESCRIPTION

In order that the above-described objects, features and advantages of the present disclosure can be easily understood, the present disclosure will be described in detail below in conjunction with the drawings and the detailed description.

In the related technical solutions, the new line defect caused by the abnormality of the compensation data may typically be eliminated by filtering the abnormal compensation data. The conventional filtering method is a sliding filtering algorithm. For example, the total number of columns of the OLED panel is M; the number N of consecutively sampled values are arranged in a queue, and the length of the queue is fixed to N; new data obtained by each sampling is placed at the end of the queue, and the data at the start of queue is removed from the queue (i.e., the First In First Out principle). A new filtered result may be obtained by performing an arithmetic averaging operation on the N data in the queue.

However, using the above-described sliding filtering algorithm will bring the abnormal compensation data into the queue, resulting in an error in the average value of the queue. When the average value of the queue is wrong, even if the obtained compensation data is normal data, the sliding filtering algorithm will judge the data as abnormal data, resulting in a new compensation defect. The abnormal compensation data may exist in N filtering results, which will cause defects in N columns. The result is that it may be seen from the screen display that there is a defect, such as an N-column block Mura (Mura referring to uneven display brightness), etc.

Figure 1:
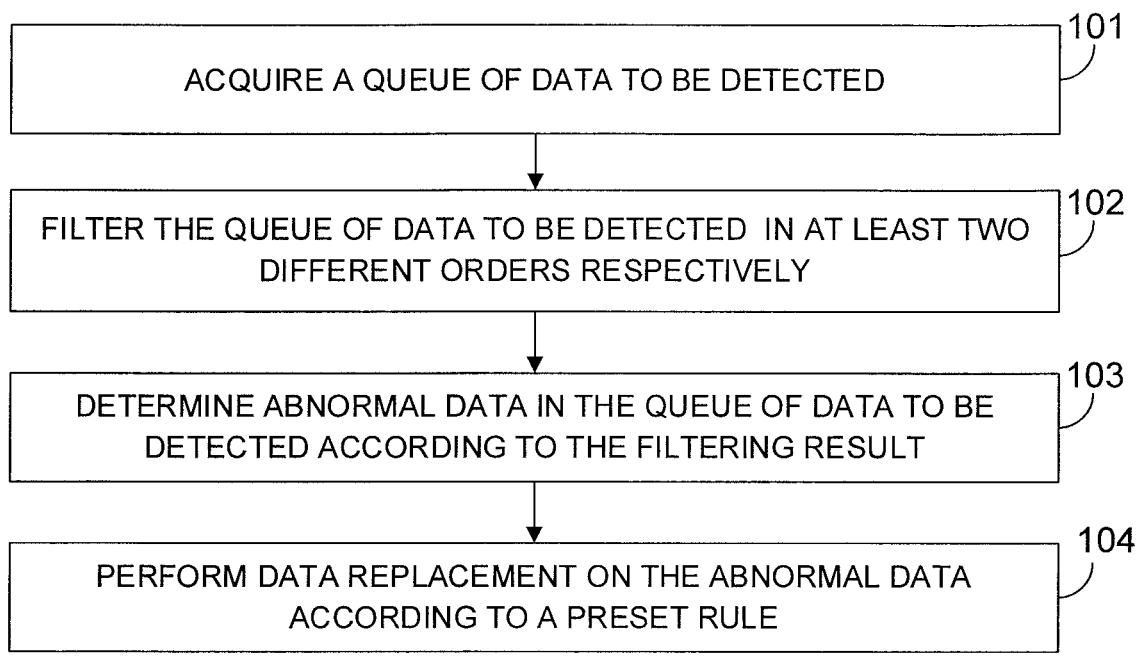
FIG. 1 is a flowchart of an abnormal data processing method according to an embodiment of the present disclosure.

Referring to FIG. 1, a flowchart of an abnormal data method according to an embodiment of the present disclosure is shown. The abnormal data processing method may specifically include the following steps.

In Step 101, a queue of data to be detected is acquired, wherein the queue of data to be detected comprises M data arranged sequentially, M being a positive integer.

The embodiment of the present disclosure may be applied to a scenario of filtering the abnormal compensation data when abnormality occurs in the compensation data in the process of performing compensation debugging on the OLED display panel.

In an embodiment of the present disclosure, in the process of performing compensation debugging on the OLED display panel, it may be detected whether there is abnormal compensation data, and if there is abnormal compensation data, a data queue in which the abnormal compensation data is located may be acquired as a queue of data to be detected, which will be described in detail later, and thus are not described herein.

In actual applications, the skilled in the art may also obtain the queue of data to be detected in other ways, which is not limited by the embodiments of the present disclosure.

After the queue of data to be detected is acquired, the process proceeds to Step 102.

In Step 102, the queue of data to be detected is filtered with a filtering algorithm in at least two different orders respectively, wherein a window used in the filtering algorithm has a size of N, N being a positive integer smaller than M.

After the queue of data to be detected is acquired, the queue of data to be detected is filtered with the filtering algorithm in at least two different orders respectively. For example, there are a number M=3 of data, e.g., 1, 2, 3, in the queue of data to be detected, the positive order is 1, 2, 3, and the window used in the filtering algorithm has a size of N=2. Firstly, the queue of data to be detected is filtered in the order of 1, 2, 3, that is, the average of (1, 2) and the average of (2, 3) are calculated; then the queue of data to be detected is filtered in the order of 3, 2, 1, that is, the average of (3, 2) and the average of (2, 1) are calculated.

It may be understood that the above examples are merely examples for better understanding the technical solutions of the embodiments of the present disclosure, but are not intended to be the only limitation of the embodiments of the present disclosure.

In which order the filtering of the queue of data to be detected is performed will be described in detail later, which thus is not described in detail herein.

After the queue of data to be detected are filtered with the filtering algorithm in at least two different orders respectively, the process proceeds to Step 103.

In Step 103, abnormal data in the queue of data to be detected is determined according to the filtering result.

After the queue of data to be detected is filtered in at least two different orders respectively, the abnormal data in the queue of data to be detected may be determined according to the filtering result. For example, after the queue of data to be detected is filtered in a positive order and a reverse order, the position of the abnormal data detected in the filtering process in the positive order is compared with the position of the abnormal data detected in the filtering process in the reverse order, and the abnormal data at the same position is regarded as the abnormal data in the queue of data to be detected.

It may be understood that the above examples are merely examples for better understanding the technical solutions of the embodiments of the present disclosure, but are not intended to be the only limitation of the embodiments of the present disclosure.

How to determine the abnormal data in the queue of data to be detected will be described in detail later, which thus is not described in detail herein.

In Step 104, data replacement is performed on the abnormal data according to a preset rule.

In an embodiment of the present disclosure, the preset rule may be a rule that an entire column of data is replaced. For example, after determining the abnormal data in the queue of data to be detected, a column in which the abnormal data is located may be acquired, and various data of the column in which the abnormal data is located are all replaced.

In the data replacement process, an average value of data other than the abnormal data may be calculated, and the abnormal data may be replaced with the average value. Specifically, it will be described in detail later, which thus is not described herein.

The abnormal data processing method according to the embodiment of the present disclosure acquires the queue of data to be detected, filters the queue of data to be detected with the filtering algorithm in at least two different orders respectively, determines abnormal data in the queue of data to be detected according to the filtering result, and performs data replacement on the abnormal data according to the preset rule. The embodiment of the present disclosure determines the abnormal data by comparing the abnormal data acquired by the at least two filtering operations, and only replaces the data that is determined to be abnormal by the at least two filtering operations, thereby reducing the influence of misjudgment of the sliding filtering algorithm.

Figure 2:
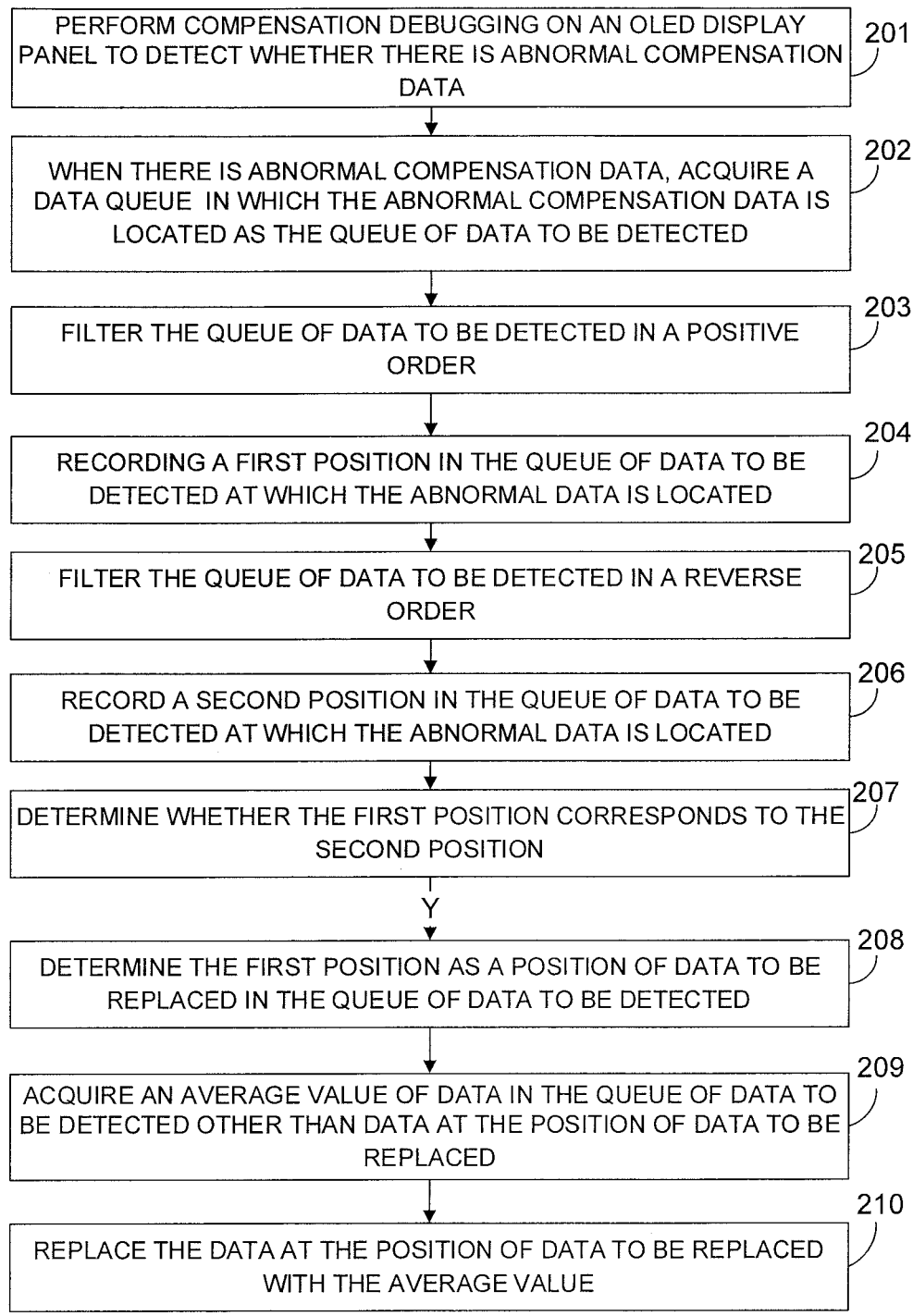
FIG. 2 is a flowchart of an abnormal data processing method according to an embodiment of the present disclosure.

Referring to FIG. 2, a flowchart of an abnormal data processing method according to an embodiment of the present disclosure is shown. The abnormal data processing method may specifically include the following steps.

In Step 201, compensation debugging is performed on an OLED display panel to detect whether there is abnormal compensation data.

The embodiment of the present disclosure may be applied to a scenario of filtering the abnormal compensation data when abnormality occurs in the compensation data in the process of performing compensation debugging on the OLED display panel.

In the process of performing compensation debugging on the OLED display panel, it may be detected whether there is abnormal compensation data, and if there is abnormal compensation data and the abnormal data is located in a certain unit of the OLED panel, data in this unit may all be regarded as the abnormal data. For example, when a block mura occurs at some position on the OLED display panel, it is determined that abnormality of compensation data occurs at this position, and the compensation data in the unit where the position is located is regarded as the abnormal data.

It may be understood that the above examples are merely examples for better understanding the technical solutions of the embodiments of the present disclosure, but are not intended to be the only limitation of the embodiments of the present disclosure.

When it is detected that there is abnormal data, the process proceeds to Step 202.

In Step 202, when there is abnormal compensation data, a data queue in which the abnormal compensation data is located is acquired as the queue of data to be detected.

When there is abnormal compensation data, the abnormal compensation data can be acquired, and the abnormal data is in a certain unit of the OLED panel, then the data in this unit may all be regarded as the abnormal data. The data on respective sensing lines in this unit constitute the queue of data to be detected.

After the queue of data to be detected is acquired, the process proceeds to Step 203.

In Step 203, the queue of data to be detected is filtered in a positive order.

Figure 2A:
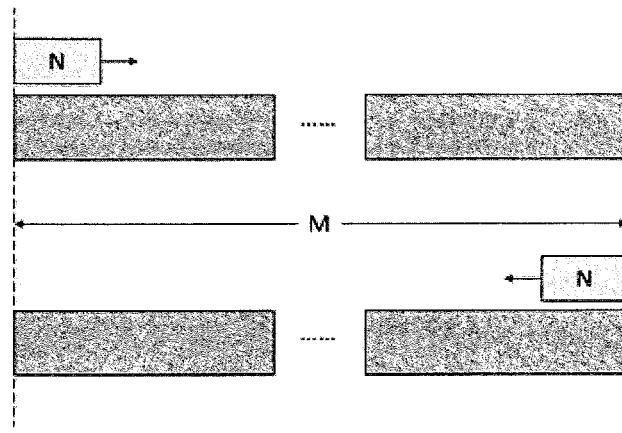
FIG. 2a is a diagram of a filtering process according to an embodiment of the present disclosure.

After the queue of data to be detected is acquired, the queue of data to be detected may be filtered in the positive order. For example, referring to FIG. 2a, a diagram of a filtering process according to an embodiment of the present disclosure is shown. As shown in FIG. 2a, N represents a size of a filtering window, and M represents the number of data in the queue of data to be detected. When the M data are being filtered, the queue of data to be detected is filtered from left to right, i.e., the queue of data to be detected is filtered in the positive order, i.e., the N data in M are respectively filtered from left to right.

It may be understood that the above examples are merely examples for better understanding the technical solutions of the embodiments of the present disclosure, but are not intended to be the only limitation of the embodiments of the present disclosure.

Of course, any of methods that may filter the data may be applied to the present disclosure, which thus may not be described in detail herein.

After the queue of data to be detected is filtered in the positive order, the process proceeds to Step 204.

In Step 204, a first position in the queue of data to be detected at which the abnormal data is located is recorded.

In an embodiment of the present disclosure, the first position refers to position(s) at which the abnormal data is located in the queue of data to be detected. For example, as shown in FIG. 2a, M is 16, and N is 8, that is, there are 16 data in the queue of data to be detected, and the queue of data to be detected is filtered by a window with a size of 8. When the 10-th data in the queue is abnormal, the recorded first positions are 10, 11, 12, 13, 14, 15, and 16. That is, when the filtering window goes forward to the 10-th data, the filtering result shows an abnormality, and the 10-th position is recorded as the first position. When the filtering window goes forward to the 11-th data, the filtering result shows an abnormality, and the 11-th position is recorded as the first position, and so on. When the filtering window goes forward to the 16-th position, the filtering result shows an abnormality, and the 16-th position is recorded as the first position.

It may be understood that the above examples are merely examples for better understanding the technical solutions of the embodiments of the present disclosure, but are not intended to be the only limitation of the embodiments of the present disclosure.

After the first position is recorded, the process proceeds to Step 205.

In Step 205, the queue of data to be detected is filtered in a reverse order.

After the queue of data to be detected is acquired, the queue of data to be detected may be filtered in the positive order. For example, as shown in FIG. 2a, N represents a size of a filtering window, and M represents the number of data in the queue of data to be detected. When the M data are being filtered, the queue of data to be detected is filtered from right to left, i.e., the queue of data to be detected is filtered in the positive order, i.e., the N data in M are respectively filtered from right to left.

It may be understood that the above examples are merely examples for better understanding the technical solutions of the embodiments of the present disclosure, but are not intended to be the only limitation of the embodiments of the present disclosure.

Of course, any of methods that may filter the data may be applied to the present disclosure, which thus may not be described in detail herein.

After the queue of data to be detected is filtered in the reverse order, the process proceeds to Step 206.

In Step 206, a second position in the queue of data to be detected at which the abnormal data is located is recorded.

In an embodiment of the present disclosure, the second position refers to position(s) at which the abnormal data is located in the queue of data to be detected. For example, as shown in FIG. 2a, M is 16, and N is 8, that is, there are 16 data in the queue of data to be detected, and the queue of data to be detected is filtered by a window with a size of 8. When the 10-th data is abnormal, the recorded second positions are 10, 9, 8, 7, 6, 5, 4, 3.

It may be understood that the above examples are merely examples for better understanding the technical solutions of the embodiments of the present disclosure, but are not intended to be the only limitation of the embodiments of the present disclosure.

After the second position is recorded, the process proceeds to Step 207.

In Step 207, it is determined whether the first position corresponds to the second position.

In an embodiment of the present disclosure, after the first positions obtained by filtering in the positive order and the second positions obtained by filtering in the reverse order are recorded, each of the first positions may be compared with the respective second positions respectively to determine whether a first position corresponds to any of the second positions. For example, as shown in FIG. 2a, assuming N=8, when the sliding filtering algorithm performs the sliding filtering from left to the right on the panel, the recorded first positions are 1000, 1001, 1002, 1003, 1004, 1005, 1006, 1007 respectively; when the sliding filtering algorithm performs the sliding filtering from right to left on the panel, the recorded second positions are 993, 994, 995, 996, 997, 998, 999, 1000 respectively. Then, there is a first position that corresponds to a second position, that is, 1000.

It may be understood that the above examples are merely examples for better understanding the technical solutions of the embodiments of the present disclosure, but are not intended to be the only limitation of the embodiments of the present disclosure.

In the case where there is no first position corresponding to any of the second position, the embodiment of the present disclosure takes no action. Then, the abnormal compensation data acquisition process is applied to the next OLED display panel unit.

If there is a first position corresponding to a second position, the process proceeds to Step 208.

In Step 208, the first position is determined as a position of data to be replaced in the queue of data to be detected.

If there is a first position corresponding to a second position, the first position (i.e., the second position) is determined as the position of data to be replaced in the queue of data to be detected. For example, in the example in Step 207 as described above, the position 1000 is determined as the position of data to be replaced.

After the position of data to be replaced is determined, the process proceeds to Step 209.

In Step 209, an average value of data in the queue of data to be detected other than data at the position of data to be replaced is acquired.

After the position of data to be replaced is determined, the average value of data in the queue of data to be detected other than the data at the position of data to be replaced is acquired. For example, there are 4 data in the queue of data to be detected, and the position of data to be replaced is the third one, then the average value of data other than the third data is calculated, that is, the average value of the first, second and fourth data is calculated. For example, the first data are 2 and 4, the second data are 3 and 5, and the fourth data are 4 and 6, then the average value is: (2+4+3+5+4+4)/6=4.

Of course, when there are a plurality of positions of data to be replaced in the queue of data to be detected, the average value of data other than data at these positions of the data to be replaced is calculated.

It may be understood that the above examples are merely examples for better understanding the technical solutions of the embodiments of the present disclosure, but are not intended to be the only limitation of the embodiments of the present disclosure.

After the average value is acquired, the process proceeds to Step 210.

In Step 210, the data at the position of data to be replaced is replaced with the average value.

In an example, after the average value is acquired, the column in which the abnormal data is located may be acquired, and various data of the column where the abnormal data is located are replaced by the average value, that is, all the data on the column corresponding to the position of data to be replaced are respectively replaced with the average value.

The abnormal data processing method according to the embodiment of the present disclosure acquires the queue of data to be detected, filters the queue of data to be detected with the filtering algorithm in at least two different orders respectively, determines abnormal data in the queue of data to be detected according to the filtering result, and performs data replacement on the abnormal data according to the preset rule. The embodiment of the present disclosure determines the abnormal data by comparing the abnormal data acquired by the at least two filtering operations, and only replaces the data that is determined to be abnormal by the at least two filtering operations, thereby reducing the influence of misjudgment of the sliding filtering algorithm.

Figure 3:
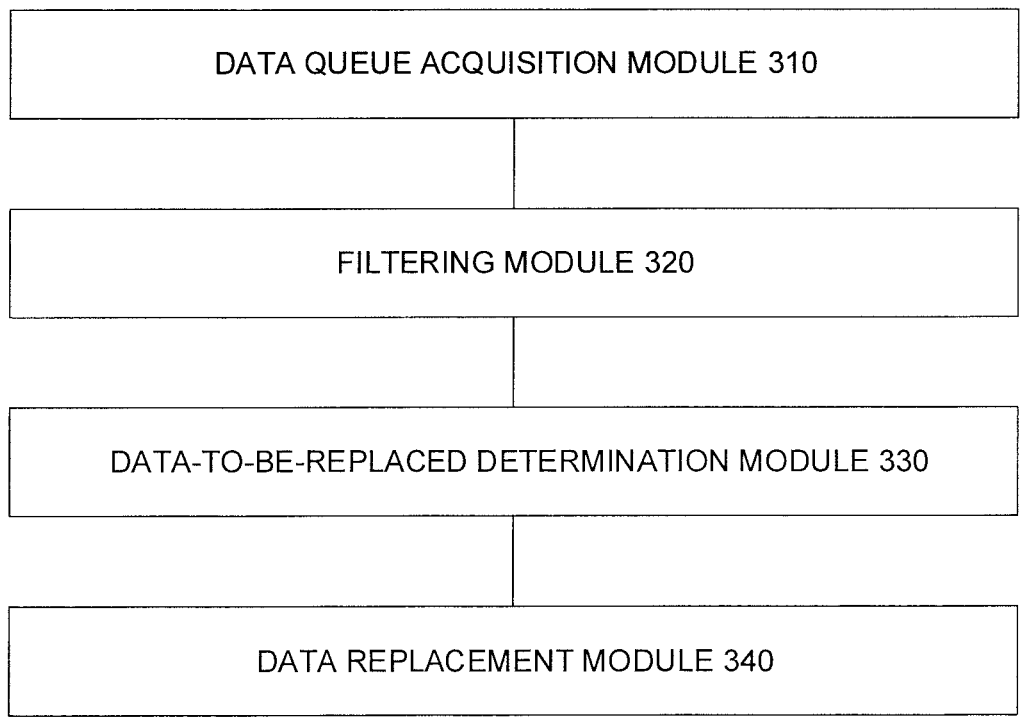
FIG. 3 is a schematic structural diagram of an abnormal data processing device according to an embodiment of the present disclosure.

Referring to FIG. 3, a schematic structural diagram of an abnormal data processing device according to an embodiment of the present disclosure is shown, which may specifically include:

a data queue acquisition module 310, configured to acquire a queue of data to be detected, wherein the queue of data to be detected comprises M data arranged sequentially, M being a positive integer; a filtering module 320, configured to filter the queue of data to be detected with a filtering algorithm in at least two different orders respectively, wherein a window used in the filtering algorithm has a size of N, N being a positive integer smaller than M; a data-to-be-replaced determination module 330, configured to determine abnormal data in the queue of data to be detected according to the filtering result; and a data replacement module 340, configured to perform data replacement on the abnormal data according to a preset rule.

The abnormal data processing device according to the embodiment of the present disclosure acquires the queue of data to be detected, filters the queue of data to be detected with the filtering algorithm in at least two different orders respectively, determines abnormal data in the queue of data to be detected according to the filtering result, and performs data replacement on the abnormal data according to the preset rule. The embodiment of the present disclosure determines the abnormal data by comparing the abnormal data acquired by the at least two filtering operations, and only replaces the data that is determined to be abnormal by the at least two filtering operations, thereby reducing the influence of misjudgment of the sliding filtering algorithm.

Figure 4:
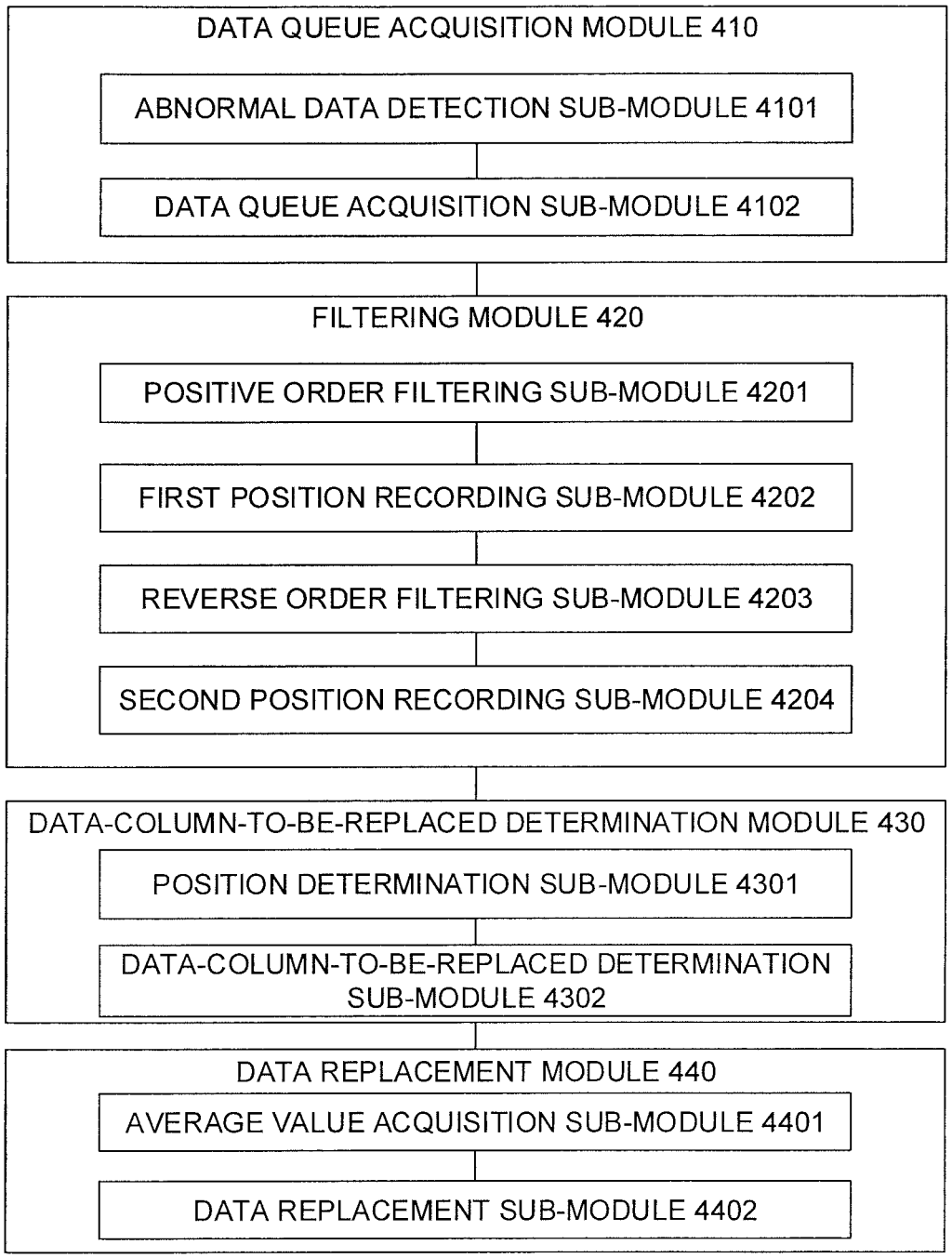
FIG. 4 is a schematic structural diagram of an abnormal data processing device according to an embodiment of the present disclosure.

Referring to FIG. 4, a schematic structural diagram of an abnormal data processing device according to an embodiment of the present disclosure is shown, which may specifically include:

a data queue acquisition module 410, configured to acquire a queue of data to be detected, wherein the queue of data to be detected comprises M data arranged sequentially, M being a positive integer; a filtering module 420, configured to filter the queue of data to be detected with a filtering algorithm in at least two different orders respectively, wherein a window used in the filtering algorithm has a size of N, N being a positive integer smaller than M; a data-to-be-replaced determination module 430, configured to determine abnormal data in the queue of data to be detected according to the filtering result; and a data replacement module 440, configured to perform data replacement on the abnormal data according to a preset rule.

Alternatively, the data queue acquisition module 410 includes: an abnormal data detection sub-module 4101, configured to perform compensation debugging on an OLED display panel to detect whether there is abnormal compensation data; and a data queue acquisition sub-module 4102, configured to acquire a data queue in which the abnormal compensation data is located as the queue of data to be detected if there is abnormal compensation data.

Alternatively, the filtering module 420 includes: a positive order filtering sub-module 4201, configured to filter the queue of data to be detected in a positive order; a first position recording sub-module 4202, configured to record a first position in the queue of data to be detected at which the abnormal data is located when the positive order filtering sub-module 4201 filters the queue of data to be detected in the positive order; a reverse order filtering sub-module 4203, configured to filter the queue of data to be detected in a reverse order; and a second position recording sub-module 4204, configured to record a second position in the queue of data to be detected at which the abnormal data is located when the reverse order filtering sub-module 4203 filters the queue of data to be detected in the reverse order.

Alternatively, the data-to-be-replaced determination module 430 includes: a position determination sub-module 4301, configured to determine whether the first position corresponds to the second position; and a data-to-be-replaced determination sub-module 4302, configured to determine the first position as a position of data to be replaced in the queue of data to be detected if the first position corresponds to the second position.

Alternatively, the data replacement module 440 includes: an average value acquisition sub-module 4401, configured to acquire an average value of data in the queue of data to be detected other than data at the position of data to be replaced; and a data replacement sub-module 4402, configured to replace the data at the position of data to be replaced with the average value.

The abnormal data processing device according to the embodiment of the present disclosure acquires the queue of data to be detected, filters the queue of data to be detected with the filtering algorithm in at least two different orders respectively, determines abnormal data in the queue of data to be detected according to the filtering result, and performs data replacement on the abnormal data according to the preset rule. The embodiment of the present disclosure determines the abnormal data by comparing the abnormal data acquired by the at least two filtering operations, and only replaces the data that is determined to be abnormal by the at least two filtering operations, thereby reducing the influence of misjudgment of the sliding filtering algorithm.

Figure 5:
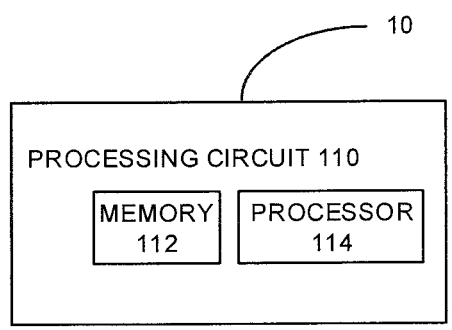
FIG. 5 is a schematic structural diagram of an embodiment of an abnormal data processing device according to the present disclosure.

FIG. 5 is a schematic structural diagram of an embodiment of an abnormal data processing device according to the present disclosure. The abnormal data processing device 10 has a processing circuit 110. In some embodiments, the processing circuit may include a memory 112 and a processor 114. The processing circuit may be configured to perform one or more of the functions as described in the present disclosure. In addition to the conventional processors and memories, the processing circuit 110 may include integrated circuits for processing and/or control, such as one or more processors and/or processor cores and/or FPGAs (field programmable gate arrays) and/or ASICs (Application Specific Integrated Circuits).

The processing circuit 110 may include and/or be coupled to and/or configured to access (e.g., write and/or read) the memory 112, which may include any type of volatile and/or nonvolatile memories, e.g., a cache and/or buffer memory and/or RAM (random access memory) and/or ROM (read only memory) and/or optical memory and/or EPROM (erasable programmable read only memory). Such a memory 112 can be configured to store computer program codes and/or other data that can be executed by the processor 114, such as the queue of data to be detected, and the like. The processing circuit 110 may be configured to control any of the methods as described in the present disclosure and/or enable such a method to be performed by, for example, the processor 114. Corresponding computer program codes may be stored in the memory 112, which may be readable and/or readablely coupled to the processing circuit 110. In other words, the processing circuit 110 may include a controller that may include a microprocessor and/or a microcontroller and/or an FPGA (Field Programmable Gate Array) device and/or an ASIC (Application Specific Integrated Circuit) device. It may be contemplated that the processing circuit 110 includes or may be coupled to or can be coupled to a memory that can be adapted to be accessible by the controller and/or the processing circuit 110 for reading and/or writing.

According to an embodiment of the present disclosure, the processor 114 may execute the computer program codes stored in the memory 112 to: acquire a queue of data to be detected, wherein the queue of data to be detected comprises M data arranged sequentially, M being a positive integer; filter the queue of data to be detected with a filtering algorithm in at least two different orders respectively, wherein a window used in the filtering algorithm has a size of N, N being a positive integer smaller than M; determine abnormal data in the queue of data to be detected according to the filtering result; and perform data replacement on the abnormal data according to a preset rule.

According to another embodiment of the present disclosure, the processor 114 may execute the computer program codes stored in the memory 112 to: perform compensation debugging on an OLED display panel to detect whether there is abnormal compensation data; and acquire a data queue in which the abnormal compensation data is located as the queue of data to be detected if there is abnormal compensation data.

According to another embodiment of the present disclosure, the processor 114 may execute the computer program codes stored in the memory 112 to: filter the queue of data to be detected in a positive order; record a first position in the queue of data to be detected at which the abnormal data is located when filtering the queue of data to be detected in the positive order; filter the queue of data to be detected in a reverse order; and record a second position in the queue of data to be detected at which the abnormal data is located when filtering the queue of data to be detected in the reverse order.

According to another embodiment of the present disclosure, the processor 114 may execute computer program codes stored in the memory 112 to: determine whether the first position corresponds to the second position; and determine the first position as a position of data to be replaced in the queue of data to be detected, in response to the first position corresponding to the second position.

According to another embodiment of the present disclosure, the processor 114 may execute the computer program codes stored in the memory 112 to acquire an average value of data in the queue of data to be detected other than data at the position of data to be replaced; and replace the data at the position of data to be replaced with the average value.

As will be appreciated by those skilled in the art, the concepts described herein can be embodied as a method, an information processing system, and/or a computer program product. Thus, the concepts described herein may take the form of an entirely hardware embodiment, an entirely software embodiment, or a combination of hardware and software embodiments, which are collectively referred to herein as "circuits" or "modules." Furthermore, the present disclosure can take the form of a computer program product on a tangible computer readable storage medium having computer program code executable by a computer embodied in a medium. Any suitable tangible computer readable storage medium may be utilized, including a hard disk, a CD-ROM, an electrical storage device, an optical storage device, or a magnetic storage device.

Some embodiments are described herein with reference to the flowcharts of the methods and/or the block diagrams of the systems. It will be understood that each block of the flowcharts and/or block diagrams, and combinations of blocks of the flowcharts and/or block diagrams can be implemented by computer program instructions. These computer program instructions may be provided to a processor of a general purpose computer (thus creating a special purpose computer), a special purpose computer or other programmable information processing apparatus for generating a machine such that the instructions, executed by a processor or other programmable information processing apparatus of the computer, create means for implementing the functions/actions specified in the flowcharts and/or block diagrams.

The computer program instructions may also be stored in a computer readable memory or a storage medium that directs a computer or other programmable information processing device to operate in a particular manner, such that the instruction means stored in the computer readable memory generate an article that including instructions for implementing functions/actions specified in one or more of the blocks of the flowcharts and/or block diagrams.

The computer program instructions may also be loaded into a computer or other programmable information processing device to cause a series of operational steps to be performed on the computer or other programmable device to generate computer-implemented processing, so that the instructions executed on the computer or other programmable device provide steps for implementing the functions/actions specified in one or more of the blocks of the flowcharts and/or block diagrams.

Various embodiments in the present specification are described in a progressive manner, and each embodiment focuses on differences from other embodiments, and the same/similar parts between various embodiments may be referred to each other.

Finally, it should also be noted that in this context, relational terms, such as first and second, are used merely to distinguish one entity or operation from another entity or operation, but do not necessarily require or imply that there is any such actual relationship or order between these entities or operations. Furthermore, the terms "comprising" or "including" or any other variations are intended to encompass a non-exclusive inclusion, so that a process, method, product or device including a series of elements includes not only those elements, but also other elements that are explicitly listed or elements that are inherent to such a process, method, product, or device. An element defined by the phrase "comprising a . . . " does not exclude the presence of additional equivalent elements in the process, method, product or device including the element.

The above describes an abnormal data processing method and an abnormal data processing device according to the present disclosure. The specific examples are used herein to explain the principles and implementation manners of the present disclosure. The description of the above embodiments is only used to facilitate to understand the method of the present disclosure and its core idea; meanwhile, in the light of the idea of the present disclosure, there may be modifications in the specific embodiments and application scopes. The content of the specification should not be construed as limiting the present disclosure.

We claim:

1. An abnormal data processing method performed by a computer, comprising:

performing compensation debugging on an Organic Light-Emitting Diode (OLED) display panel to detect whether there is abnormal compensation data;

acquiring a data queue in with the abnormal compensation data is located as a queue of data to be detected if there is abnormal compensation data, wherein the queue of data to be detected comprises M data arranged sequentially, M being a positive integer;

filtering the queue of data to be detected with a filtering algorithm in at least two different orders respectively, wherein a window used in the filtering algorithm has a size of N, N being a positive integer smaller than M;

determining abnormal data in the queue of data to be detected according to the filtering result; and performing data replacement on the abnormal data according to a preset rule, wherein said filtering the queue of data to be detected with the filtering algorithm in at least two different orders respectively comprises:

filtering the queue of data to be detected in a positive order;

recording a first position in the queue of data to be detected at which the abnormal data is located when filtering the queue of data to be detected in the positive order;

filtering the queue of data to be detected in a reverse order; and recording a second position in the queue of data to be detected at which the abnormal data is located when filtering the queue of data to be detected in the positive order.

2. The abnormal data processing method of claim 1, wherein said determining the abnormal data in the queue of data to be detected according to the filtering result comprises:

determining whether the first position corresponds to the second position; and determining the first position as a position of data to be replaced in the queue of data to be detected, in response to the first position corresponding to the second position.

3. The abnormal data processing method of claim 2, wherein said performing the data replacement on the abnormal data according to the preset rule comprises:

acquiring an average value of data in the queue of data to be detected other than data at the position of data to be replaced; and replacing the data at the position of data to be replaced with the average value.

4. An abnormal data processing device, comprising:

a memory that stores computer program codes;

a processor configured to execute the computer program codes to perform the method of claim 1.

5. A computer readable storage medium storing computer program codes, which, when executed by at least one processor, cause the at least one processor to perform the method of claim 1.

* * * * *